United States Patent [19]

Sadamatsu et al.

[11] Patent Number: 4,536,950

[45] Date of Patent: Aug. 27, 1985

[54] METHOD FOR MAKING SEMICONDUCTOR DEVICE

[75] Inventors: Hideaki Sadamatsu, Hirakata; Michihiro Inoue, Ikoma; Akihiro Kanda; Akira Matsuzawa, both of Neyagawa, all of Japan

[73] Assignee: Matsushita Electric Industrial Co., Ltd., Kadoma, Japan

[21] Appl. No.: 578,036

[22] Filed: Feb. 8, 1984

[30] Foreign Application Priority Data

Feb. 10, 1983 [JP] Japan .................................. 58-20660
Feb. 10, 1983 [JP] Japan .................................. 58-20662
Feb. 10, 1983 [JP] Japan .................................. 58-20663

[51] Int. Cl.³ .................. H01L 21/225; H01L 21/265
[52] U.S. Cl. .................................... 29/578; 29/576 B; 29/571; 148/15; 148/188; 357/34
[58] Field of Search ............... 29/578, 576 B; 148/1.5, 148/188; 357/34

[56] References Cited

U.S. PATENT DOCUMENTS

| 4,252,582 | 2/1981 | Anantha et al. | 148/188 |
| 4,266,985 | 5/1981 | Ito et al. | 29/578 |
| 4,347,654 | 9/1982 | Allen et al. | 29/578 |
| 4,416,055 | 11/1983 | McCarthy et al. | 29/578 |

FOREIGN PATENT DOCUMENTS

| 81/01911 | 7/1981 | Int'l Pat. Institute | 357/34 |
| 45878 | 4/1977 | Japan | 357/34 |
| 88723 | 6/1982 | Japan | 148/1.5 |

OTHER PUBLICATIONS

Ning et al: "Self-Aligned Bipolar Transistors for High-Performance and Low-Power Delay VLSI," IEEE Transactions on Electron Devices, vol. ED-28, No. 9, Sep. 1981, pp. 1010-1013.

Fujita et al: "Flat Emitter Transistor with Self-Aligned Base," Proceedings of the 12th Conf. on Solid State Devices, Tokyo, 1980, Jap. J. of Appl. Physics, vol. 20, (1981), Supp. 20-1, pp. 149-153.

Primary Examiner—Brian E. Hearn
Assistant Examiner—Hunter L. Auyang
Attorney, Agent, or Firm—Cushman, Darby & Cushman

[57] ABSTRACT

In making a vertical bipolar transistors, after forming by diffusion process a region to become inactive base region an oxide film is selectively formed on the region, thereafter an ion implantation is carried out to produce regions which become the active base region and emitter region by using the oxide film; thereby such a configuration is formed so that defect part (108) induced at the time of the ion implantation is confined in the emitter region, thereby minimizing the leakage current at the PN junction, and hence assuring production of high performance and high reliability semiconductor devices; further, a high integration is attained by adopting self-alignment in forming emitter contact.

7 Claims, 37 Drawing Figures

FIG. 2 (A) (Prior Art)
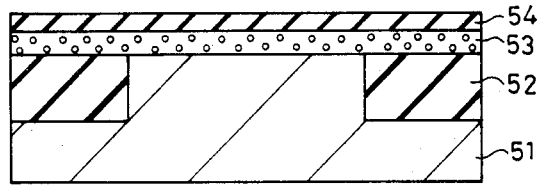
FIG. 2 (B) (Prior Art)
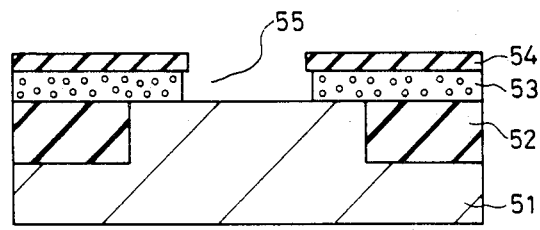
FIG. 2 (C) (Prior Art)
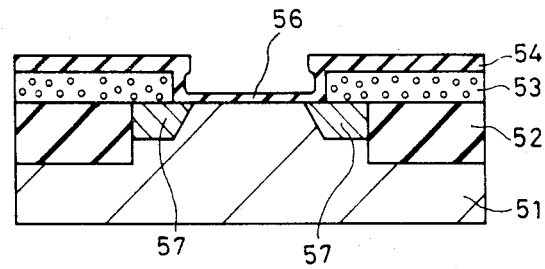
FIG. 2 (D) (Prior Art)
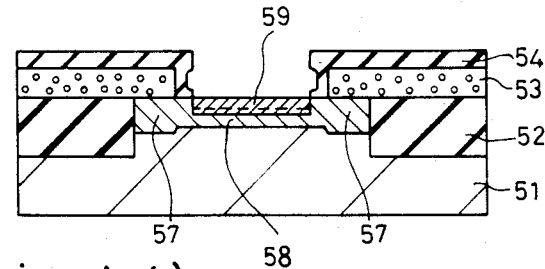
FIG 2 (E) (Prior Art)
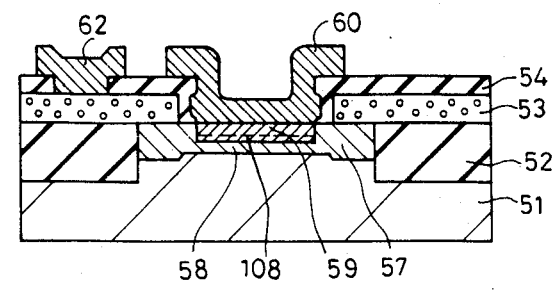

METHOD FOR MAKING SEMICONDUCTOR DEVICE

BACKGROUND OF THE INVENTION

1. Field of the Invention

The present invention relates to a method for making a semiconductor device of high integration, high speed and high accuracy. More particularly, the present invention relates to an improved method for making semiconductor devices comprising vertical bipolar transistors formed with high integration, designed for high speed operation and manufactured with high accuracy for stable performance.

2. Description of the Prior Art

Recently, semiconductor devices have been developed to have even higher integration and high speed operation, and transistors with self-aligned contact are necessary. In order to fulfill these requirements, the emitter part is structured in the self-aligned configuration by utilizing an antioxidation film, and forming the emitter and the base by ion-implantation is adopted in the conventional manufacturing process. The above-mentioned conventional process is described with reference to the appended FIG. 1(A), FIG. 1(B), FIG. 1(C), FIG. 1(D), FIG. 1(E) and FIG. 1(F).

Firstly, on a principal surface of an n-type silicon substrate 1, a $SiO_2$ film 2 is formed with a thickness of about 4000 Å by, for instance, a known oxidation process, and an opening is formed on the part to become the base region, as shown in FIG. 1(A).

Then, a polycrystalline silicon film 3 of about 2000 Å in thickness is deposited thereon, and As-ions are implanted with a density of $7 \times 10^{15}$ ions/cm$^2$ with a 130 KeV acceleration energy. Under this condition, the As-ions are injected in the polycrystalline silicon film 3 as shown in FIG. 1(B). Thereafter, an $Si_3N_4$ film 4 is deposited over all of the substrate to a thickness of about 500 Å, as shown in FIG. 1(C).

Then, a resist 5 of a desired pattern is formed on a part of the structure to make the emitter part, and by utilizing the resist film 5 as a mask, the $Si_3N_4$ film 4 and polycrystalline silicon film 3 surrounding the area adjacent to the resist film 5 are etched. And further, by utilizing the resist 5 and the underlying oxide mask 2 as mask, the surface part of the substrate 1 is further etched by about 0.2 μm from the level of the substrate surface as shown in FIG. 1(D). At this time, since the polycrystalline silicon film 3 containing As has a very large etching rate, the polycrystalline silicon part under the $Si_3N_4$ film 4 is etched to form an oblique face.

Next, the resist film 5 is removed by a known method, and by utilizing the $Si_3N_4$ film 4 as a mask an oxidation is carried out to form an oxide film 6 of about 1500 Å in thickness. Since the upper surface of the polycrystalline silicon film 3 is covered by the $Si_3N_4$ film 4, the upper surface of the polycrystalline silicon film 3 is not oxidized. Thereafter, boron ions are implanted with a density of $1.2 \times 10^{15}$ ions/cm$^3$ by an acceleration energy of 60 KeV, followed by a thermal treatment at 900° C. for about 30 min., to form an active base region 7 and inactive bases 8, 8. By the thermal treatment, the As in the polycrystalline silicon film 3 is diffused into the substrate 1, and therefore n-type emitter region 9 is formed, as shown in FIG. 1(E).

In the above-mentioned configuration, defects induced by ion implantation are formed as shown by broken lines 10 in the polycrystalline silicon film 3 and in the inactive base regions (8, 8).

Thereafter, the $Si_3N_4$ film 4 is removed by a known method, and a contact opening is formed on the inactive base region 8. An emitter electrode 11 and a base electrode 12 are formed as shown in FIG. 1(F). Thus, a conventional semiconductor device with a vertical bipolar transistor is completed. The above-mentioned conventional transistor has the following advantages:

(1) A high integration is achieved by use of the self-alignment of the emitter and the emitter contact.

(2) Since the side faces of the emitter region have no PN junction, there is no likelihood of an adverse elongation of transit time induced by the carved shape of the junction of the base-emitter, accordingly an excellent high frequency performance is achievable.

(3) Base resistance is small, since the active base region is connected at the part of highest concentration of the inactive base regions.

In the above-mentioned conventional example, however, the polycrystalline silicon film 3 contains As as an impurity, and when etching the polycrystalline silicon film 3 and the substrate 1 as shown in FIG. 1(D), the polycrystalline silicon film 3 under the $Si_3N_4$ film 4 is caused to have an oblique wall. Accordingly, when boron ions are implanted after forming the oxide film 6, the defect formed by the ion implantation crosses the emitter-base junction as shown by dotted line 10 in FIG. 1, thereby allowing the possibility of producing a leak current between the emitter and the base regions. Because of such a leak current, the $h_{FE}$ is likely to have scatterings and accordingly, a highly reliable, accurate transistors cannot be obtained.

In order to improve the above-mentioned problem, there is a proposal disclosed in 1980 in an IEDM (International Electron Devices Meeting) wherein a polycrystalline silicon base is used to form the active base and the emitter by an ion implantation process, which is hereafter described with reference to FIG. 2(A), FIG. 2(B), FIG. 2(C) and FIG. 2(D). Firstly, as shown in FIG. 2, on an n-type substrate 51, an insulation oxide film 52 is selectively formed, and thereafter a boron-doped polycrystalline silicon film 53 and further thereon a CVD $SiO_2$ film 54 are sequentially formed.

By utilizing a resist as a mask in RIE (reactive ion etching), the CVD $SiO_2$ 54 and the underlying polycrystalline silicon film 53 are partly removed. Thereafter, by using wet etching the boron-doped polycrystalline silicon film 53 is removed, to form an opening 55 as shown in FIG. 2(B).

Thereafter, by forming oxide film 56 by utilizing a thermal oxidation or CVD method, and by subsequent thermal treatment, boron is introduced to the substrate 51 from the polycrystalline silicon film 53, thereby forming inactive base region 57 as shown in FIG. 2(C).

Then, by another RIE, the oxide film 56 in the opening of the substrate is removed, and thereafter by means of ion implantation, an active base 58 and an emitter region 59 are formed as shown in FIG. 2(D).

The above-mentioned second conventional process has the following advantages:

(1) A high integration is attainable as a result of self-alignment between the emitter region and the emitter contact.

(2) Since the active base region and the emitter regions are formed by ion implantation, there is substantially no scattering of $h_{FE}$.

However, the above-mentioned conventional process has the following shortcomings.

(1) When the seat resistance required for the inactive base region 57 is selected to be 300 Ω/□, the polycrystalline silicon film 53 must have boron concentration of $10^{15}$/cm² and a thickness of about 3000 Å, and furthermore, the CVD SiO₂ insulation film 54 used as the mask to form the high concentration emitter 59 must be 3000 Å thick. Accordingly, the thickness difference at the opening part 55 becomes at least 6000 Å, and as a consequence the lead wires are likely to be put off during the electrode formation thereon.

(2) Since there is a need to completely remove the polycrystalline silicon film 53 containing the boron, an overetching must be made, thereby to slightly etch the surface of the substrate 51, and therefore the above-mentioned level difference becomes even greater.

(3) Since the inactive base regions 57 are formed by diffusion of impurity from the CVD polycrystalline silicon film 53, the base resistance thereof is large.

SUMMARY OF THE INVENTION

Accordingly, the purpose of the present invention is to provide a novel method of making semiconductor device suitable for making semiconductors of high accuracy and high speed by decreasing the leak current between the emitter and the base due to defects induced by ion implantation.

Another, object of the present invention is to provide a semiconductor device wherein the sheet resistance of the inactive base region is small and the accuracy of the emitter area is high by eliminating bird beaks, thereby achieving high accuracy of configuration.

The gist of the present invention is to provide in a process of making the semiconductor, for the region to become the inactive region formed by diffusion, and an oxidation film is selectively formed thereon, and further, the active base and the region to become the emitter etc., which are formed by ion implantation by utilizing the above-mentioned oxidation as a mask. By such a process, the defect induced by the ion implantation is formed only in the emitter region and thus the defects do not cross the PN junction, and therefore, a semiconductor device having a small leak current and high accuracy is obtainable.

The method for making the semiconductor device in accordance with the present invention comprises the steps of:

forming an insulation film on a surface of a semiconductor substrate of a first conductivity type, boring an opening on a selected part of the insulation film thereby exposing the surface of the substrate, forming an antioxidation film on a selected region of the exposed surface of the substrate, forming first regions of a second conductivity by type diffusion of an impurity through the opening into the part not covered by the antioxidation film, selectively forming an oxide film by a thermal oxidation step by utilizing the antioxidation film as a mask, forming a second region of the second conductivity type by an ion implantation utilizing the insulation film and the oxide film as masks in a manner to be connected to the first region, and forming, in the second region, a third region of the first conductivity type by an ion implantation utilizing the insulation film and the oxide film as a mask.

BRIEF DESCRIPTION OF THE DRAWING

FIG. 2(A), FIG. 2(B), FIG. 2(C), FIG. 2(D) and FIG. 2(E) are sectional views of the second prior art process.

DESCRIPTION OF THE PREFERRED EMBODIMENTS

Hereinafter, details of the present invention are described with reference to preferred embodiments with reference to FIGS. 3(A) and those figures that follow.

FIG. 3(A) through FIG. 3(D) show a first embodiment of the present invention.

Figure 3A:
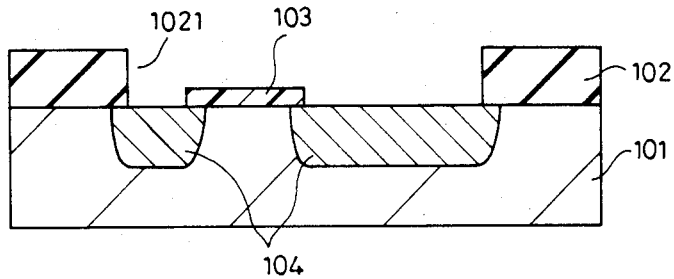
FIG. 3(A), FIG. 3(B), FIG. 3(C) and FIG. 3(D) are sectional views showing the manufacturing flow steps of a first embodiment of this invention.

Firstly, as shown in FIG. 3(A), an SiO₂ insulation film 102 of about 4000 Å is formed by, for instance, an oxidation process on a principal face of an n-conductivity type substrate 101. On a region to form the base region, an opening 1021 is formed by a known method, an Si₃N₄ film 103 as an antioxidation film is deposited to a depth of about 500 Å, and then the part to become inactive base regions of the Si₃N₄ film 103 is removed by a known method. Thereafter, by a known defusion process, inactive base regions 104, 104 of a p-conductivity type are formed, as shown in FIG. 3(A).

Figure 3B:
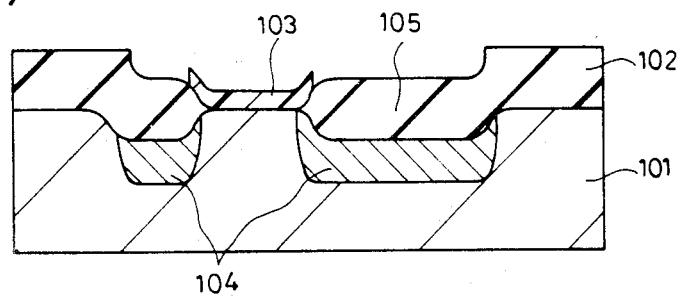

Then, a thermal oxidation method, the surface of the substrate 101 is oxidized by using the Si₃N₄ film 103 as an antioxidation mask, to form an oxide film 105 of about 3000 Å thickness as shown in FIG. 3(B). The above process is known as the LOCOS process, and as a result the surface level of the thermally oxidized film 105 comes about 1500 Å above the original surface of the substrate 101.

Figure 3C:
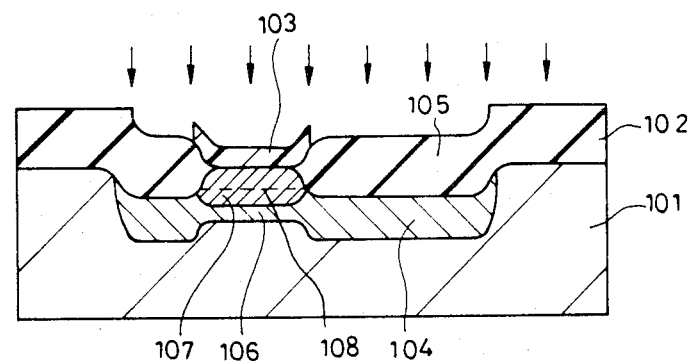

Thereafter, by utilizing the oxide films 102 and 105 as masks, an ion implantation of B is carried out through the Si₃N₄ 103 with 40 KeV energy at a density of $1-3 \times 10^{14}$ ions/cm². And further, an ion implantation of As is carried out with 180 KeV energy at a density of $7 \times 10^7$ ions/cm². Thereafter, in an N₂ atmosphere of about 1000° C., a thermal treatment is carried out for 30–60 min. thereby to form active base region 106 of a p-type conductivity and an overriding emitter region 107 of the n-conductivity type. In this step, defects induced by the ion implantation shown by dotted line 108 are confined in the emitter region 107, as shown in FIG. 3(C).

Figure 3D:
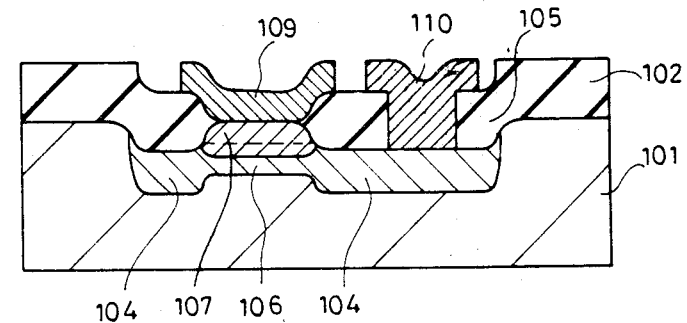

Thereafter, the $Si_3N_4$ film 103 is removed by a known method, contact-openings are bored in the oxide film 105, an emitter electrode 109 is formed on the emitter region 107 and a base electrode 110 is formed on the inactive base region 104, as shown in FIG. 3(D).

According to the present invention, the defect 108 induced by the ion implantation is totally confined in the emitter region 107, and there is no worry that the defect 108 crosses the base-emitter junction. Accordingly, the base-emitter leak current becomes very small. And furthermore, the depth of the emitter region 107 is accurately controllable, since the emitter region 107 is formed by the ion implantation. Thereby, the scattering of current gain is very much decreased and high-accuracy transistors are produced.

Furthermore, the adverse effect of side etching of the polycrystalline silicon film 3 under the $Si_3N_4$ film 4 shown in FIG. 1 of the prior art, wherein undesirable contamination of the side etched part exists, is completely eliminated. That is, in the present embodiment only the $Si_3N_4$ film 103 is removed, and thereby formation of the cave shaped part is prevented.

Still further, in the present process, the surface of the silicon substrate at the inactive base regions 104, 104 is not etched. Therefore, there is substantially no level difference of the surface. That is, when the oxide film 105 of about 300 Å in thickness can serve as a mask for the ion implantation to form the emitter region 107, the surface level difference from the surface of the original substrate 101 to the surface of the oxide film 105 is about 1500 Å, which is far smaller than 6000 Å of the prior art of FIG. 2, thus improving the reliability of wiring to be formed on the substrate.

A second embodiment in accordance with the present invention is described with reference to FIG. 4(A) through FIG. 4(H).

Firstly, on a principal face of an n-conductivity type silicon substrate 211, an $SiO_2$ film 212 of about 4000 Å in thickness is formed by, for instance, a known thermal oxidation process, followed by boring an opening to become the base region. Then, $Si_3N_4$ 213 of about 500 Å, an oxide film 214 containing a high concentration of phosphor (hereinafter is referred as PSG (phosphor silicate glass film) of about 1000 Å, and further thereon polycrystalline silicon film 215 of about 1500 Å in thickness are deposited thereon, as shown in FIG. 4(A).

Figure 4:
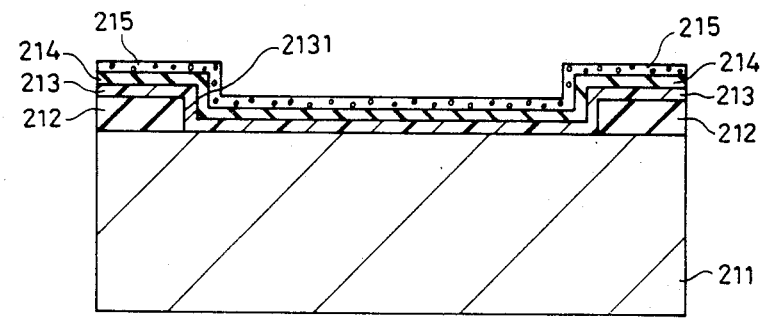
FIG. 4(A), FIG. 4(B), FIG. 4(C), FIG. 4(D), FIG. 4(E), FIG. 4(F), FIG. 4(G) and FIG. 4(H) are sectional views showing the manufacturing flow of the second embodiment of this invention.
Figure 4:
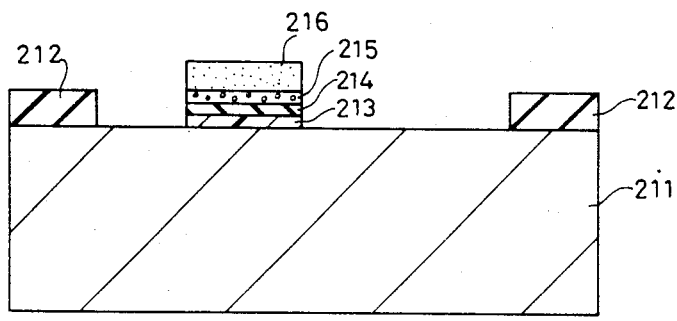
Figure 4:
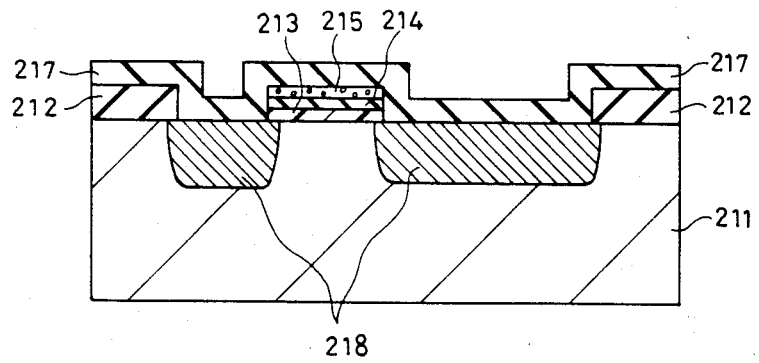
Figure 4:
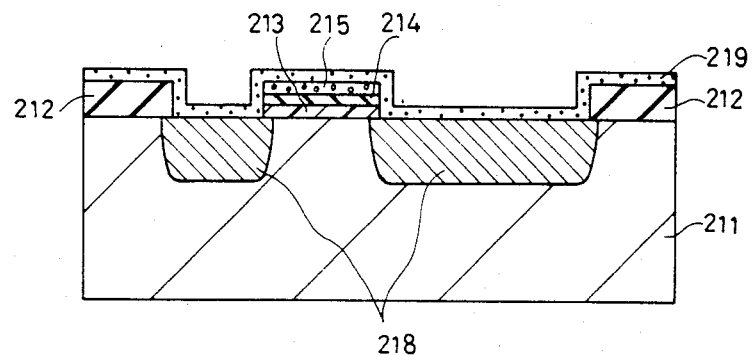
Figure 4:
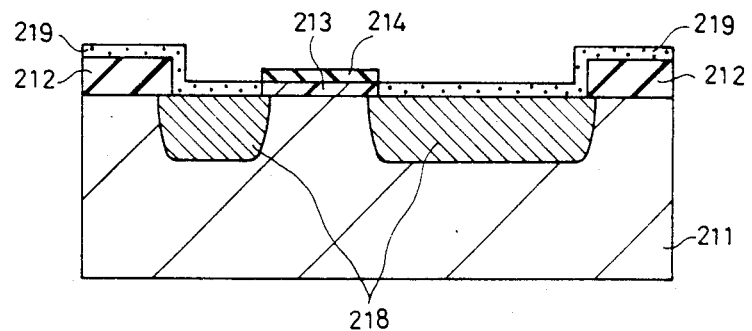
Figure 4:
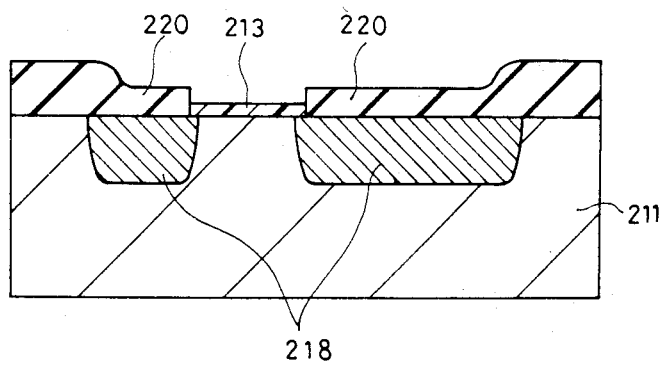
Figure 4:
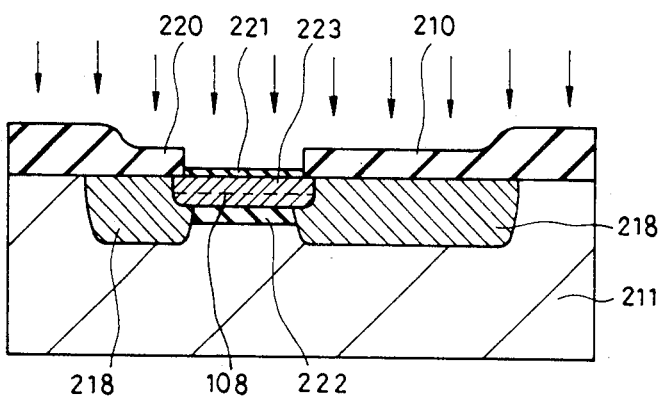
Figure 4:
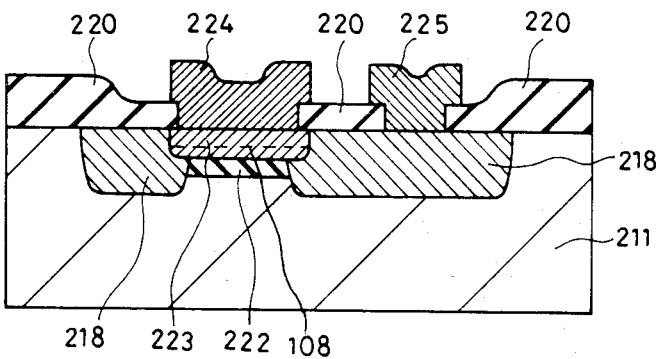

Next, on the surface of the substrate at the part where the region is located to form the emitter, a resist pattern 216 is formed, and then, the polycrystalline silicon film 215, PSG film 214 and the $Si_3N_4$ film 213 are removed by a known method using the resist pattern 16, as shown in FIG. 4(B).

Thereafter, on the entire surface of the substrate, an $SiO_2$ film containing a high concentration of boron (hereinafter is referred as BSG (boron silicate glass)) 217 is formed, followed by a known thermal diffusing process to diffuse boron from the BSG film 217 into a part of the substrate 211 to become inactive base regions, thereby to form inactive base regions 218 having a seat resistance of about 80 $\Omega/\square$, as shown in FIG. 4(C). Of course, another known diffusion method is usable.

Thereafter, the BSG film is removed by a known method using the polycrystalline silicon film 215 as a diffusion mask to retain the PSG film 214. Thereafter, a polycrystalline silicon film 219 of about 1500 Å is deposited on the entire surface of the substrate, and a thermal treatment is carried out, thereby a diffusion of phosphor from the PSG film 214 into the polycrystalline silicon film 215 thereon and further to the polycrystalline silicon film 219 thereover is made, as shown in FIG. 4(D).

Nextly, by using a known etchant, for instance, prepared as a mixture of nitric acid: fluoric acid: acetate acid in a ratio of 50:1:5 (in volume percent), the polycrystalline silicon films 215 and 219 are etched away. In this etching, since the polycrystalline silicon films 215 and 219 at the parts where the phosphor is diffused have a very fast etching rate, the polycrystalline silicon films 215 and 219 are removed only at the parts which are over the PSG film 214, as shown in FIG. 4(E).

Thereafter, by removing the PSG film 214 by a known method, the polycrystalline silicon film 219 is oxidized by utilizing the $Si_3N_4$ film 213 as a mask. The oxide film 220 formed by the oxidation has a thickness of about 3000 Å which is about twice thickness of the original polycrystalline silicon film 219 of 1500 Å. Besides, the polycrystalline silicon film 219 only is oxidized at this stage, and the substrate surface which is covered by the oxide film 212 and $Si_3N_4$ film 213 are not oxidized, as shown FIG. 4(F).

Next, the $Si_3N_4$ film 213 is removed by a known method, an oxide film 221 of about 300 Å thickness is formed instead, boron ions are ion-implanted with 40 KeV acceleration potential at a density of $1\times10^{14}$ ion/cm$^2$ by utilizing the oxide film 220 as a mask, and thereafter a heat treatment in an $N_2$ atmosphere of about 1000° C. for 30 min. is carried out to form active base regions 222 by thermal diffusion. Thereafter, As-ions are ion-implanted with a 130 KeV acceleration potential at a density of $7\times10^{15}$ ion/cm$^2$, and thereafter a heat treatment in $N_2$ atmosphere of about 1000° C. is carried out for 20 min., to form the emitter region 223, as shown in FIG. 4(G). In this process, As-ions are excluded by the thick oxide film 220 and therefore defects due to ion implantation are confined in the emitter region 223 only.

Thereafter, the oxide film 221 on the emitter region 223 is removed, and a contact opening is formed on the inactive base region 218. An emitter electrode 224 on the emitter region 223, and a base electrode 225 on the inactive base region 218 are formed by aluminum or a known material, as shown in FIG. 4(H).

In the above-mentioned example, the oxide film 220 formed on the inactive base region 218 is made by oxidizing the polycrystalline silicon 219. Accordingly, in the oxidizing process of the inactive base region 218 the polycrystalline silicon is on slightly oxidized, and the sheet resistance of the inactive base region 218 can be retained such low as about 80 $\Omega/\square$ until the last step. Furthermore, for the same reason, undesirable forming of bird beaks under the $Si_3N_4$ film 213 is prevented.

Instead of using a polycrystalline silicon film 215 formed on the PSG film 214 as the mask to protect emitter region, when removing the BSG film 217 as shown in FIG. 4(C) and FIG. 4(D), an $Si_3N_4$ film can be used as the mask. In such a case, however, it is necessary to remove the $Si_3N_4$ mask immediately after removing the BSG film 217 and prior to deposition of the polycrystalline silicon film 219.

As a modification, the forming of about 300 Å thick oxide film 221 prior to the ion implantation can be omitted.

A third embodiment is described with reference to FIG. 5(A) through FIG. 5(H) which are sectional side views showing the manufacturing flow of the third embodiment.

Figure 5:
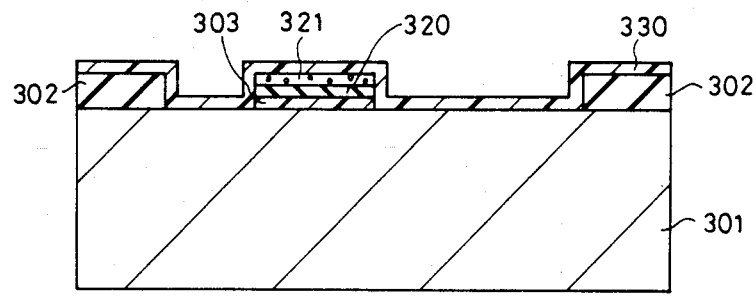
FIG. 5(A), FIG. 5(B), FIG. 5(C), FIG. 5(D), FIG. 5(E), FIG. 5(F), FIG. 5(G) and FIG. 5(H) are sectional views showing the manufacturing flow of a third embodiment of this invention.
Figure 5:
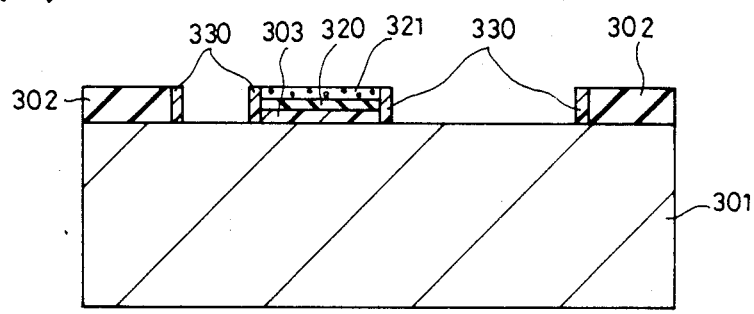
Figure 5:
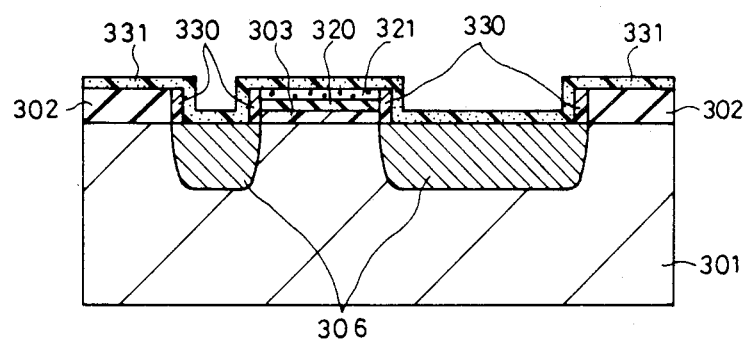
Figure 5:
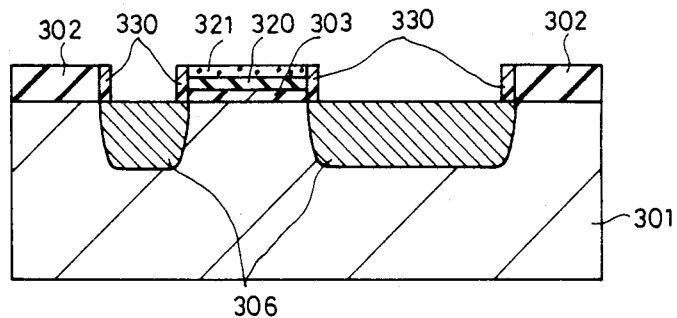

In FIG. 5, on an n-conductivity type silicon substrate 301, an oxide film 302 to become a base mask is formed, and further $Si_3N_4$ film 303, PSG film 320 and polycrystalline silicon film 321 are sequentially formed on the substrate at the portion to become the emitter region. And further, on all the principal surfaces of the substrate an $Si_3N_4$ film 330 is deposited as shown in FIG. 5(A).

Then by utilizing a known anisotropic etching, the $Si_3N_4$ film 330 is etched only retaining vertical parts covering the side sections of the $Si_3N_4$ film 303, PSG film 320 and the polycrystalline silicon film 321, as shown in FIG. 5(B).

Thereafter, by utilizing an etchant prepared as a mixture of water: fluoric acid of 50:1 (in volume ratio) a deep etching is carried out to remove any natural oxide on the collision to become inactive base region, and thereafter a BSG film 331 is deposited on all the principal surface of the substrate 301. Thereafter, by diffusing boron from the BSG film into the substrate 301, inactive base regions 306, 306 are formed as shown in FIG. 5(C). Of course, another diffusion method may be used.

Then the BSG film 331 is removed. At this time, the polycrystalline silicon film 321 and PSG film 320 side ends portion have the $Si_3N_4$ vertical films 330 covering them. Accordingly, undesirable etching-away of the PSG film 320 induced by overetching of the BSG 331 can be prevented as shown in FIG. 5(D).

Figure 5E:
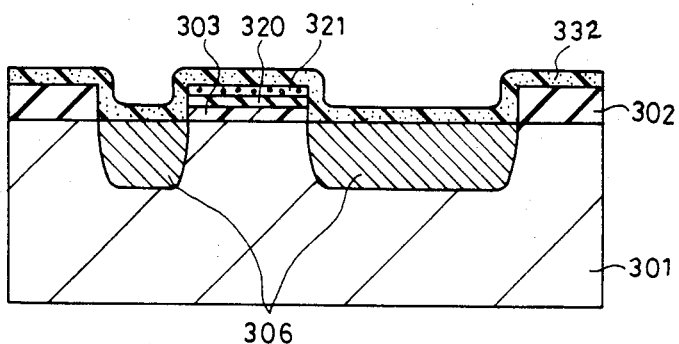
Figure 5F:
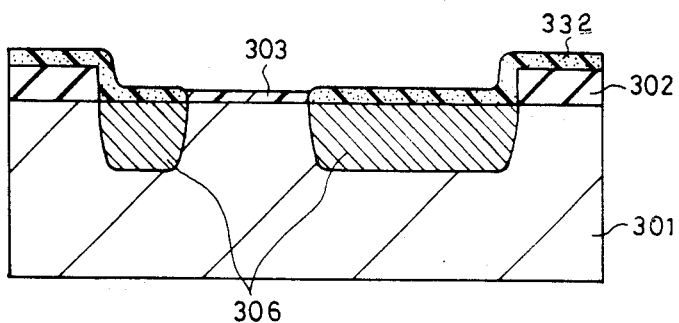

Then, the $Si_3N_4$ film 330 is removed and thereafter a polycrystalline silicon film 332 is deposited, and a heat treatment the is carried out. By the heat treatment, phosphor from the PSG film is diffused into the overriding polycrystalline silicon film 321 and further the overriding polycrystalline film 332, as shown in FIG. 5(E).

Figure 5G:
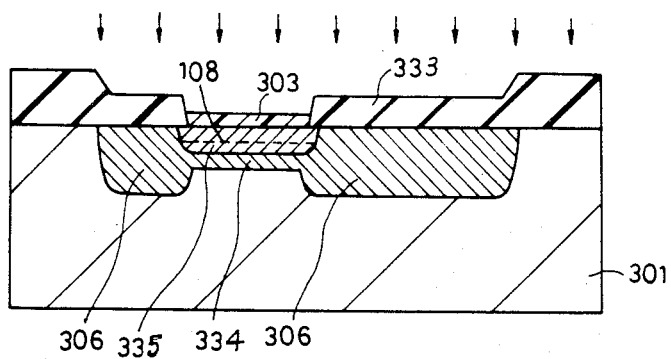
Figure 5H:
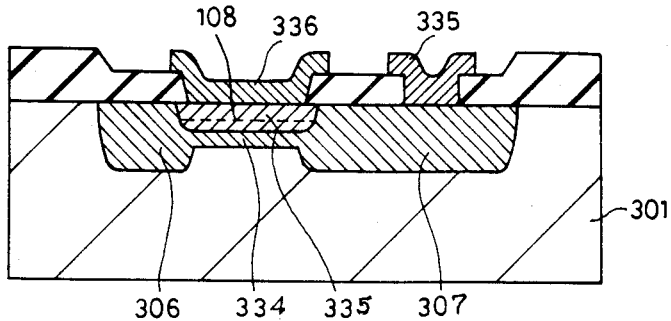
Figure 6:
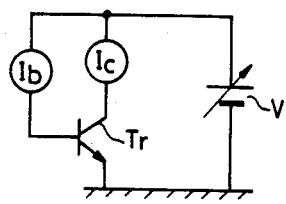
FIG. 6(A) is a measuring circuit for measuring the characteristic of the semiconductor device manufactured in accordance with the present invention.
FIG. 6(B) is a graph showing the characteristic curves of the prior art semiconductor device of FIG. 1(F).
FIG. 6(C) is a graph showing the characteristic curves of the semiconductor devices manufactured in accordance with the present invention.
Figure 7:
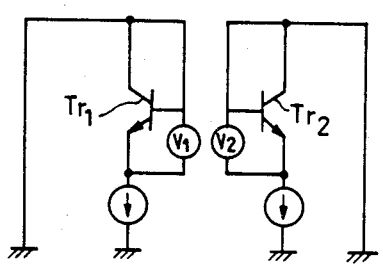
FIG. 7(A) is a measuring circuit for testing the $\Delta V_{BE}$ of distribution.
FIG. 7(B) is a graph showing the $\Delta V_{BE}$ distribution of a prior art semiconductor device of FIG. 1(F).
FIG. 7(C) is a graph showing the $\Delta V_{BE}$ distribution of semiconductor devices manufactured in accordance with the present invention.
Figure 7:
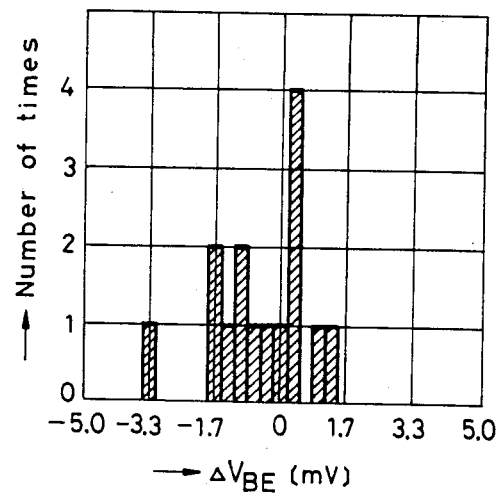
Figure 7:
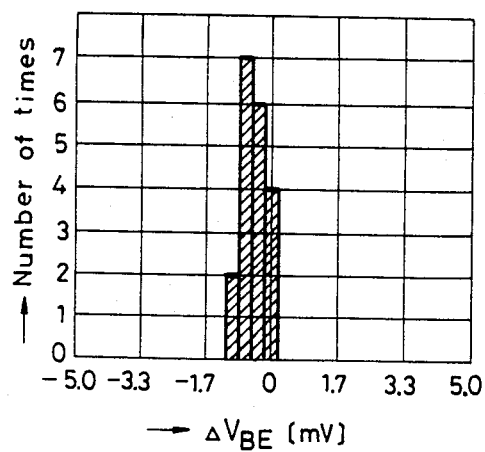
Figure 6:
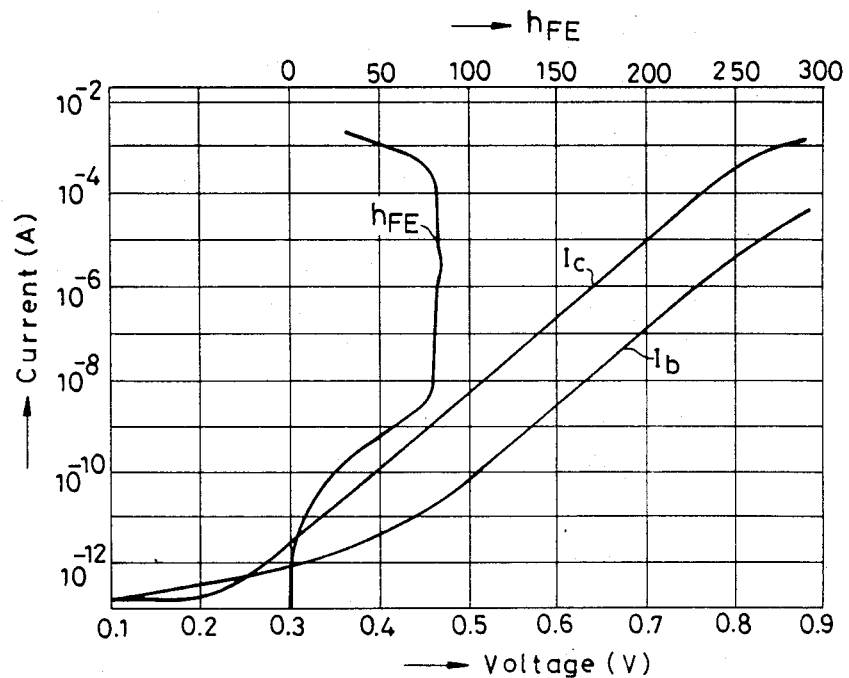
Figure 6:
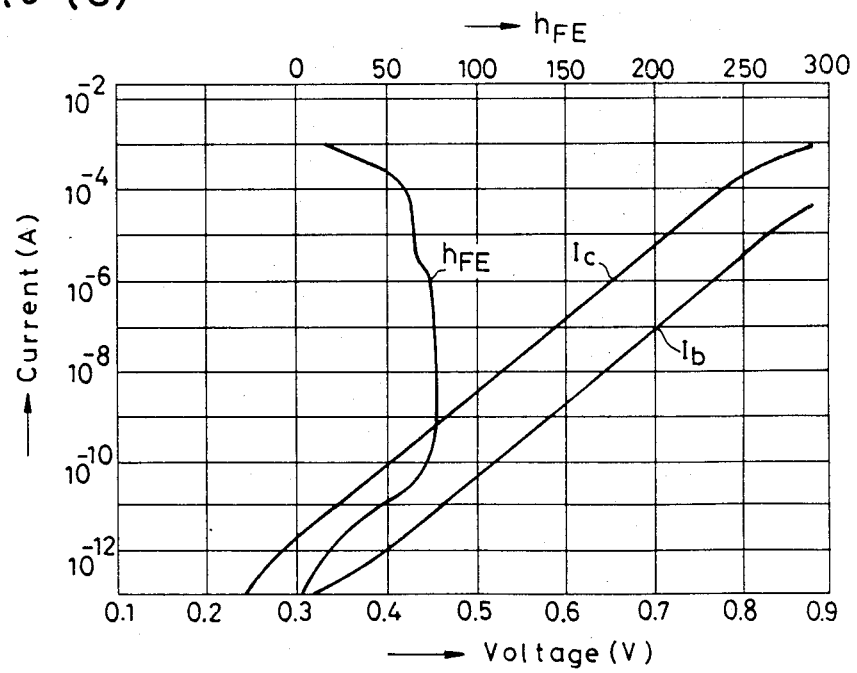

Then, the polycrystalline silicon film 332, polycrystalline silicon film 321 and the PSG film 320 at the part on the PSG film 320 are removed by a known method as shown in FIG. 3(F). Then, by oxidizing the polycrystalline silicon film 332 an oxide film 333 is formed, and by utilizing this oxide film 333 as mask an ion implantation of boron followed by a heat treatment and another ion implantation of As ions followed by another heat treatment are formed, by utilizing the oxide film 333 as a mask and through the $Si_3N_4$ film 303, thereby to form an active base region 334 and an emitter 335 therefrom as shown in FIG. 5(G).

Thereafter, the $Si_3N_4$ film 303 is removed, a contact opening is bored on the inactive base region 306, and an emitter electrode 337 and a base electrode 336 are formed by known methods as shown in FIG. 3(F).

Since the above-mentioned embodiment enables one to form the $Si_3N_4$ film 330 on the side ends of the PSG film 320, it becomes necessary to carry out a deep etching process prior to deposition of the BSG film 331. Accordingly, the scattering of sheet resistance of the inactive base regions 306, 306 can be minimized. Also this embodiment enables an overetching in the step to remove the BSG film 331, without the fear of undesirable etching of the PSG film, and therefore the etching process become easier.

In the above-mentioned embodiment, instead of the above-mentioned polycrystalline silicon film 321 on the PSG film 321, an $Si_3N_4$ film can be used.

Figure 1A:
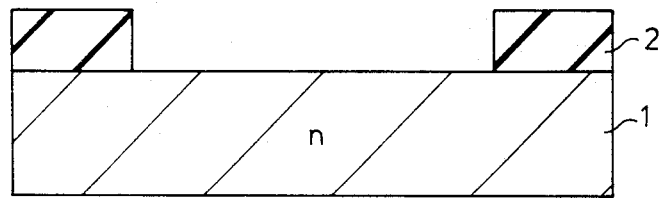
FIG. 1(A), FIG. 1(B), FIG. 1(C), FIG. 1(D), FIG. 1(E) and FIG. 1(F) are the sectional views showing the manufacturing flow steps of the first prior art process.
Figure 1B:
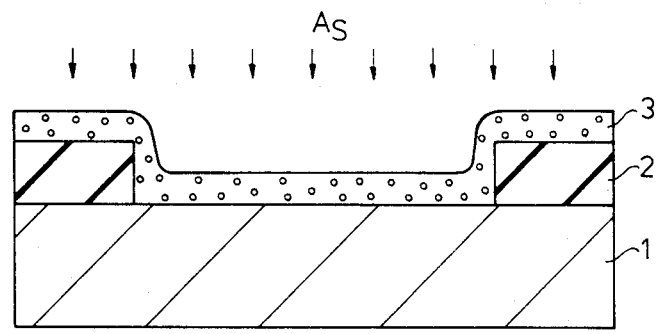
Figure 1C:
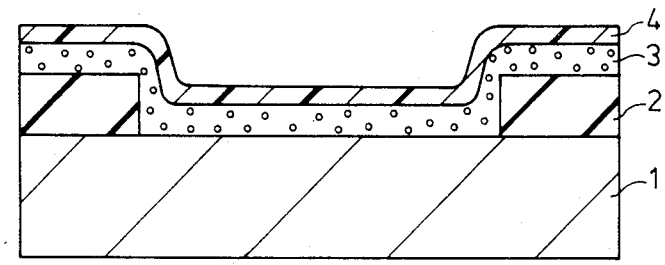
Figure 1D:
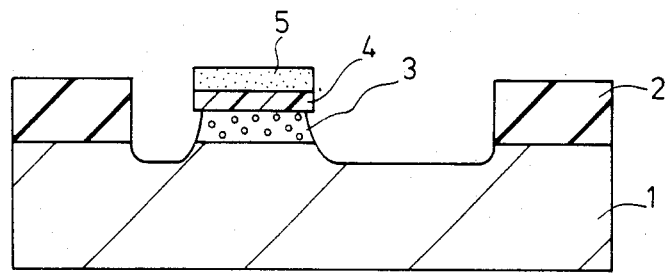
Figure 1E:
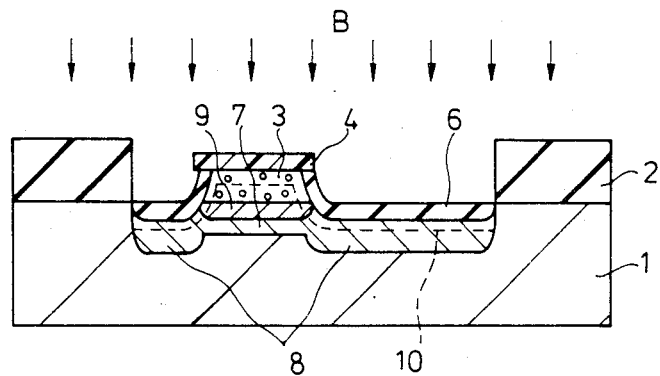
Figure 1F:
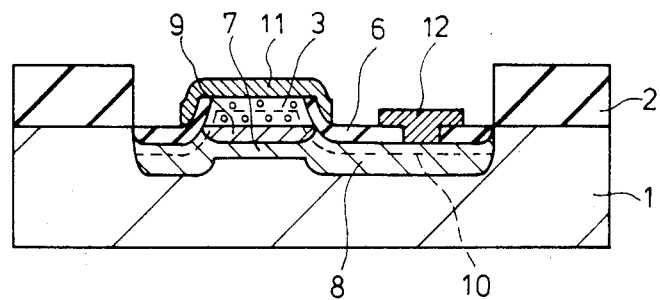

A comparison test of the results of the embodiment in accordance with the present invention over the prior art of FIG. 1(F) are described with reference to FIG. 6(A) through FIG. 7(C).

FIG. 6(A) shows the current versus voltage characteristics measurement of the circuit, wherein the emitter of a transistor is grounded and the collector and base are connected to a voltage source V and a base current $I_b$ and a collector $I_c$ are measured. FIG. 6(B) shows the current versus voltage characteristic curves and current versus $h_{FE}$ characteristic curve of the prior art devices and FIG. 6(C) shows those characteristic curves of a semiconductor device manufactured by the first embodiment of the present invention. As is obvious from these graphs, in the characteristic curves of the prior art shown in FIG. 6(B), the base current $I_b$ bends to the horizontal direction in the range of $I_b$ of $10^{-10}$ A or lower, due to the existence of a leak current. Accordingly the $h_{FE}$ of the prior art case decreases in the range of $I_b$ of $5 \times 10^{-9}$ A or lower. On the other hand, in the characteristic curves of the present invention as shown in FIG. 6(C), the base current $I_b$ shows a straight line characteristic until a small $I_b$ of about $5 \times 10^{-12}$ A, because almost no leak current exists. Accordingly, the current amplification coefficient $h_{FE}$ is also constant to the low range of $I_c$ of about $10^{-10}$ A.

Next, the characteristic of the base-emitter voltage difference of a pair transistor $\Delta V_{BE}$ is compared between the prior art of FIG. 1 and the embodiment method with reference to FIG. 7(A) through FIG. 7(C). The $\Delta V_{BE}$ characteristic determines, the accuracy of a comparator manufactured by utilizing a semiconductor device made in accordance with the present invention. The measurement circuit employed is shown in FIG. 7(A) wherein the emitter of each pair transistor is grounded through an ampere meter, a voltage source is connected between the base and the emitter and the base and the collector are commonly grounded. In the measurement circuit, the dispersion $\Delta V_{BE}$ of the base-emitter voltage when the emitter current $I_b$ is made constant is measured. FIG. 7(B) shows the data of measurement of semiconductor devices manufactured in accordance with the prior art of FIG. 1, and FIG. 7(C) shows the data of semiconductor devices manufactured by the process of the first embodiment of the present invention. The ordinates show the number of times and the abscissa shows $\Delta V_{BE}$. As is obvious from a comparison of FIG. 7(B) and FIG. 7(C), the present invention can provide semiconductor devices with smaller scattering and smaller standard deviations since the leak current is small. As is described in detail above, the method in accordance with the present invention can achieve better performance by confining the defects induced by ion implantation into the emitter region, thereby minimizing leak the current at the PN junction face, thus providing a manufacturing process for making a high accuracy semiconductor device.

What is claimed is:

1. A method of making semiconductor device comprising the successive steps of:
    (1) forming an insulation film on a surface of semiconductor substrate of a first conductivity type;

(2) boring an opening in a selected portion of said insulation film thereby exposing said surface of said substrate;

(3) forming an antioxidation film directly on a selected region of said exposed surface of said substrate;

(4) forming first regions of a second conductivity by diffusion of an impurity through said opening into the portion of said substrate not covered by said antioxidation film;

(5) selectively forming an oxide film over the exposed surface of said substrate and the exposed surface of said first regions by thermal oxidation utilizing said antioxidation film as a mask;

(6) forming a second region of said second conductivity type communicating with said first regions by ion implantation through said antioxidation film on said semiconductor substrate using said insulation film and said oxide film as an integral mask; and (7) forming a third region of said first conductivity type by ion implantation through said antioxidation film in said first and second regions using said insulation film and said oxide film as an integral mask.

2. The method for making semiconductor device in accordance with claim 1 in which the semiconductor substrate is an epitaxial layer formed on a silicon substrate of a second conductivity type.

3. A method for making semiconductor device comprising the successive steps of:

(1) forming at least one insulation film on a surface of a semiconductor substrate of a first conductivity type;

(2) boring an opening in a selected portion of said insulation film thereby exposing said surface of said substrate;

(3) forming an antioxidation film directly on a selected region of said exposed surface of said substrate;

(4) forming a first oxide film containing a high concentration of impurity of said first conductivity type on said antioxidation film;

(5) forming first regions of a second conductivity type in said semiconductor substrate by diffusing an impurity using said antioxidation film as a mask;

(6) forming an overriding polycrystalline silicon film over the entire surface of said substrate;

(7) diffusing an impurity of said first conductivity type from said first oxide film into said overriding polycrystalline silicon film;

(8) selectively removing predetermined portions of polycrystalline silicon film which are on said first oxide film;

(9) removing said first oxide film;

(10) oxidizing said polycrystalline silicon film using said antioxidation film as a mask to produce a second oxide mask on said semiconductor substrate;

(11) forming a second region of said second conductivity type connected to said first region by ion implantation through said antioxidation film on said semiconductor substrate using said insulation film and said oxide film as an integral mask;

(12) forming a third region of said first conductivity type by ion implantation through said antioxidation film in said first and second region using said insulation film and said second oxide film as an integral mask;

(13) removing said antioxidation film; and

(14) forming an electrode on the region from which said anitoxidation film has been removed.

4. The method for making semiconductor device in accordance with claim 3 in which the semiconductor substrate is an epitaxial layer formed on a silicon substrate of a second conductivity type.

5. The method for making semiconductor device in accordance with claim 3 in which step 4 further comprises etching to form side end portions and forming a second antioxidation film covering said side end portions.

6. The method for making semiconductor device in accordance with claim 3 in which said antioxidation film is an $Si_3N_4$ film.

7. The method for making semiconductor device in accordance with claim 3 in which a second antioxidation film is formed on said first oxide film after forming said first oxide film.

* * * * *